(12) United States Patent
Cai et al.

(10) Patent No.: US 10,108,472 B2
(45) Date of Patent: Oct. 23, 2018

(54) ADAPTIVE READ DISTURB RECLAIM POLICY

(71) Applicant: SK hynix Inc., Gyeonggi-do OT (KR)

(72) Inventors: Yu Cai, San Jose, CA (US); Fan Zhang, Fremont, CA (US); June Lee, Sunnyvale, CA (US); Haibo Li, Sunnyvale, CA (US)

(73) Assignee: SK Hynix Inc., Gyeonggi-do (KR)

( * ) Notice: Subject to any disclaimer, the term of this patent is extended or adjusted under 35 U.S.C. 154(b) by 158 days.

(21) Appl. No.: 15/154,767

(22) Filed: May 13, 2016

(65) Prior Publication Data

US 2016/0335144 A1    Nov. 17, 2016

Related U.S. Application Data

(60) Provisional application No. 62/161,094, filed on May 13, 2015.

(51) Int. Cl.
| | | |
|---|---|---|
| *G06F 11/00* | (2006.01) | |
| *G06F 11/07* | (2006.01) | |
| *G11C 16/34* | (2006.01) | |
| *G11C 29/52* | (2006.01) | |
| *G11C 29/42* | (2006.01) | |
| *G11C 29/44* | (2006.01) | |
| *G11C 29/04* | (2006.01) | |

(52) U.S. Cl.
CPC ........ *G06F 11/076* (2013.01); *G06F 11/0727* (2013.01); *G11C 16/3427* (2013.01); *G11C 29/52* (2013.01); *G11C 29/42* (2013.01); *G11C 29/44* (2013.01); *G11C 2029/0411* (2013.01)

(58) Field of Classification Search
CPC ... G11C 29/88; G11C 16/349; G11C 16/3495; G06F 11/10; G06F 11/106; G06F 11/008; G06F 11/1072
See application file for complete search history.

(56) References Cited

U.S. PATENT DOCUMENTS

| | | | | |
|---|---|---|---|---|
| 4,479,214 A | * | 10/1984 | Ryan ...................... | G11C 29/88 365/200 |
| 5,892,937 A | * | 4/1999 | Caccavale ............... | G06F 11/32 711/135 |
| 8,793,556 B1 | * | 7/2014 | Northcott ............ | G06F 11/1068 365/185.29 |
| 2002/0091965 A1 | * | 7/2002 | Moshayedi ........... | G06F 11/004 714/6.13 |
| 2005/0013165 A1 | * | 1/2005 | Ban ...................... | G06F 11/1068 365/185.2 |
| 2007/0260811 A1 | * | 11/2007 | Merry, Jr. ........... | G06F 12/0246 711/103 |
| 2008/0055989 A1 | * | 3/2008 | Lee ...................... | G06F 11/1068 365/185.09 |

(Continued)

*Primary Examiner* — Bryce P Bonzo
*Assistant Examiner* — Jeison C Arcos
(74) *Attorney, Agent, or Firm* — IP & T Group LLP

(57) ABSTRACT

Memory systems may include a memory including a plurality of memory blocks, and a controller suitable for, incrementing a first counter corresponding to a block of the plurality of blocks when the block is read, incrementing a second counter when the first counter reaches a predefined count number, determining an error count of the block when the second counter is incremented, and initiating a reclaim function when the error count exceeds an error threshold.

15 Claims, 6 Drawing Sheets

(56) References Cited

U.S. PATENT DOCUMENTS

| | | | |
|---|---|---|---|
| 2009/0228646 A1* | 9/2009 | Edwards | G06F 12/0866 711/113 |
| 2010/0100664 A1* | 4/2010 | Shimozono | G06F 3/0611 711/103 |
| 2010/0122200 A1* | 5/2010 | Merry, Jr. | G06F 12/0246 715/771 |
| 2010/0235713 A1* | 9/2010 | Lee | G06F 11/1072 714/763 |
| 2013/0346805 A1* | 12/2013 | Sprouse | G11C 16/3418 714/42 |
| 2014/0136883 A1* | 5/2014 | Cohen | G06F 11/2094 714/6.11 |
| 2014/0136884 A1 | 5/2014 | Werner et al. | |
| 2014/0237165 A1* | 8/2014 | Seo | G06F 12/0246 711/103 |
| 2015/0012685 A1* | 1/2015 | Avila | G06F 12/0246 711/103 |
| 2015/0355845 A1 | 12/2015 | Lee et al. | |
| 2016/0011782 A1* | 1/2016 | Kurotsuchi | G06F 12/16 711/104 |
| 2017/0131947 A1* | 5/2017 | Hoang | G06F 3/0653 |
| 2017/0131948 A1* | 5/2017 | Hoang | G06F 3/0653 |

\* cited by examiner

60

ADAPTIVE READ DISTURB RECLAIM POLICY

CROSS-REFERENCE TO RELATED APPLICATIONS

This application claims the benefit of U.S. Provisional Application No. 62/161,094 filed May 13, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Aspects of the invention include memory systems. The memory systems may include a memory including a plurality of memory blocks, and a controller suitable for, incrementing a first counter corresponding to a block of the plurality of blocks when the block is read, incrementing a second counter when the first counter reaches a predefined count number, determining an error count of the block when the second counter is incremented, and initiating a reclaim function when the error count exceeds an error threshold.

Further aspects of the invention include methods. The methods may include incrementing a first counter corresponding to a block of a plurality of blocks of a memory when the block is read, incrementing a second counter when the first counter reaches a predefined count number, determining an error count of the block when the second counter is incremented, and initiating a reclaim function when the error count exceeds an error threshold.

Additional aspects of the invention include memory devices. The memory devices may include a memory including a plurality of memory blocks, a first counter, a second counter, and a controller configured to increment the first counter corresponding to a block of the plurality of blocks when the block is read, increment the second counter when the first counter reaches a predefined count number, determine an error count of the block when the second counter is incremented, and initiate a reclaim function when the error count exceeds an error threshold.

DETAILED DESCRIPTION

Figure 1:
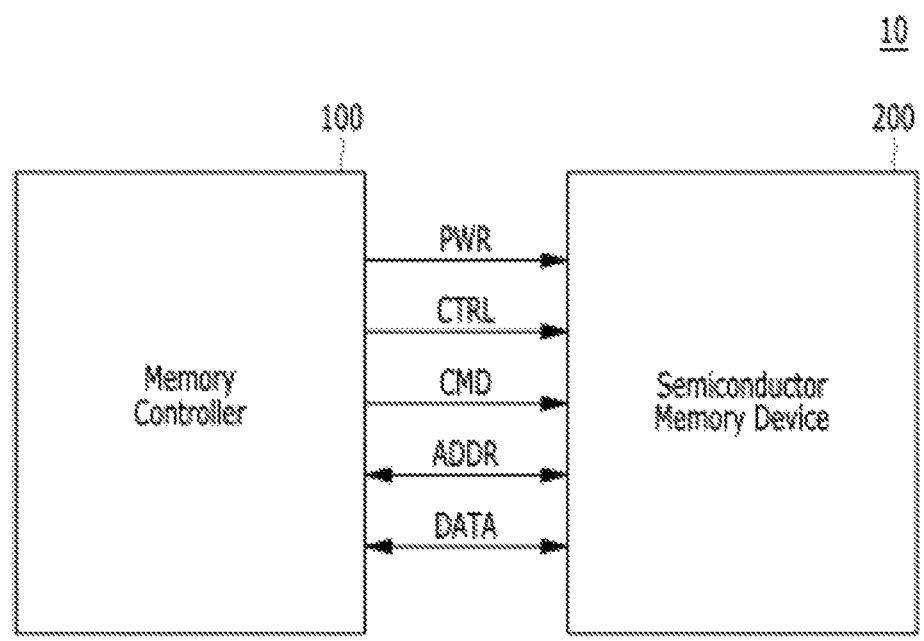
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system a composition of matter; a computer program product embodied on a computer readable storage medium; and/or a processor, such as a processor suitable for executing instructions stored on and/or provided by a memory coupled to the processor. In this specification, these implementations, or any other for that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described n detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal an address latch enable (ALE) signal, a chip enable (CE) signal, a rite enable (WE) signal, a read enable (RE) signal and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided s one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
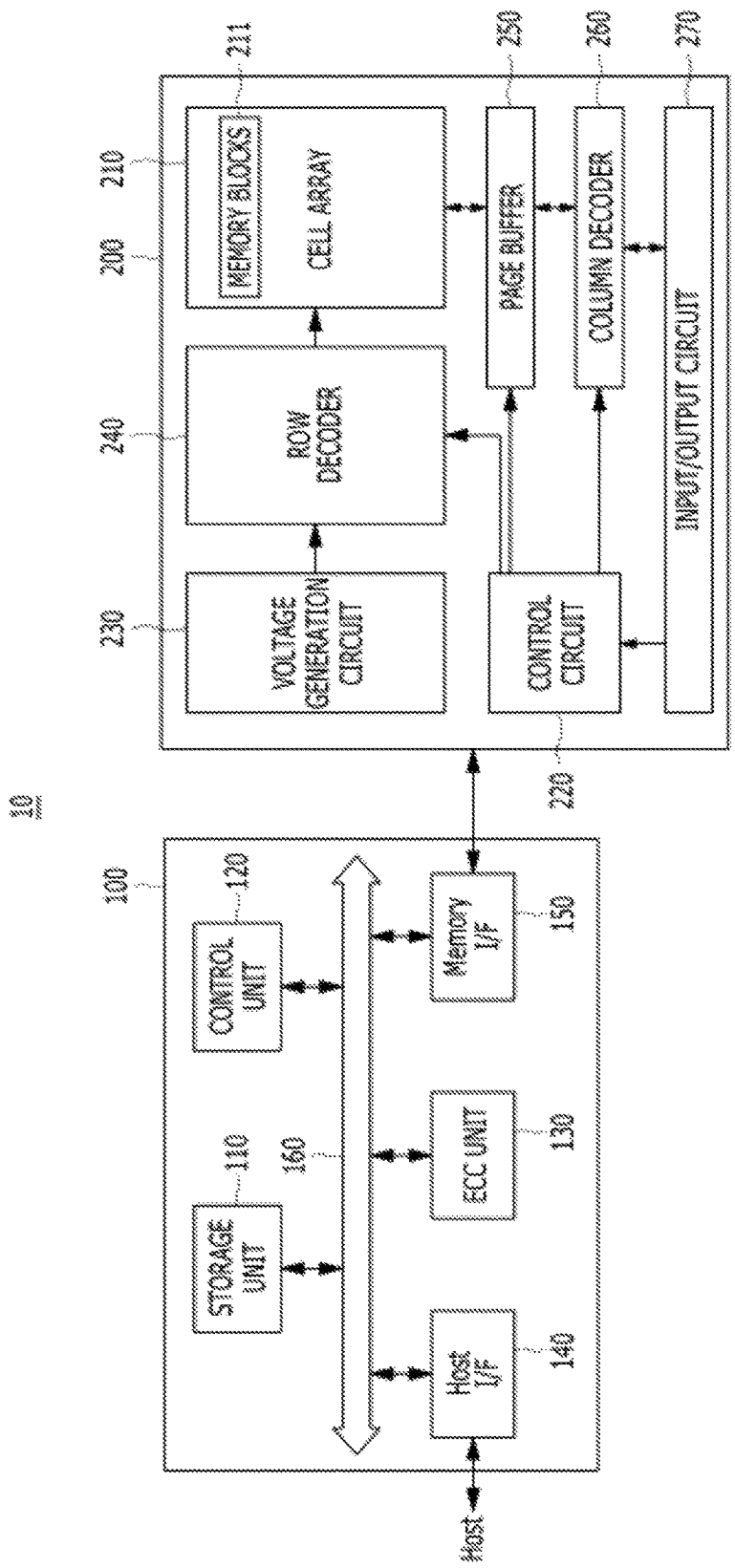
FIG. 2 is a block diagram illustrating a memory system in accordance with an embodiment of the present invention.

FIG. 2 is a detailed block diagram illustrating a memory system in accordance with an embodiment of the present invention. For example the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments the ECC unit 130 may perform an error correction operation based on a coded modulation such as a low density parity check (LDPC) code, a Bose-Chaudhuri-Hocquenghem (BCH) rode, a turbo code, a turbo product code (TPC), a Reed-Solomon (RS) code, a convolution code, a recursive systematic code (RSC), a trellis-coded modulation (TCM), a Block coded modulation (BCM), and so on The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
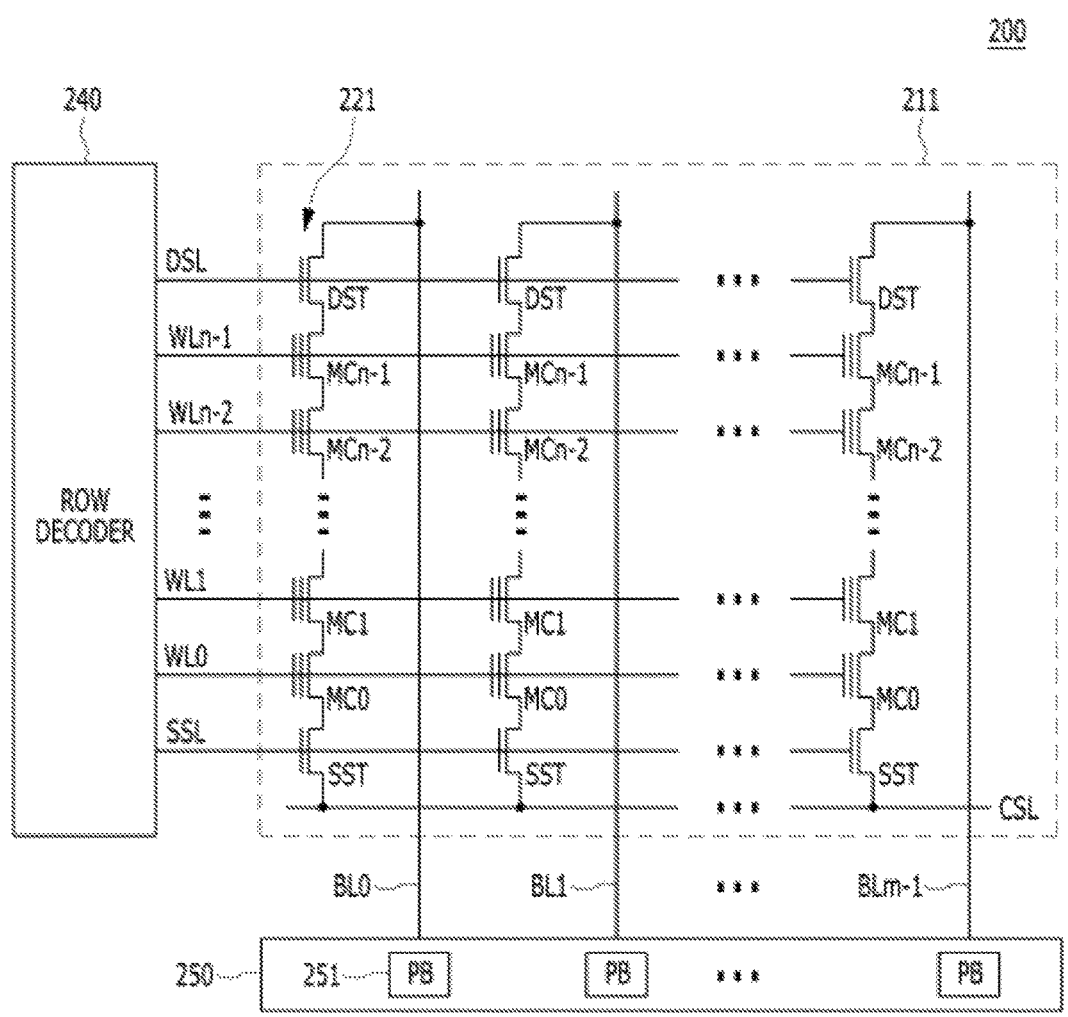
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Accumulated read disturb errors are one of the major sources of flash errors. When the cells on the wordline are read, the cells on the other wordlines in the same block will be disturbed by the relative high $V_{pass}$ voltage applied during read operation. Although one read operation has very small impact on neighbor wordlines, the accumulated reads over time can eventually introduce enough errors so that the total number of errors will be larger than the ECC error correction capability, causing uncorrectable errors and data loss.

The read disturb errors can be overcome by flash correct and refresh. The main ideas are to read data from flash memory before the flash media accumulates too many errors than ECC can correct, leverage the ECC engine in flash controller to correct these errors, and reprogram the error free data into flash memory. One key question is when to reclaim the data under read disturb before the errors become uncorrectable.

A problem with current solutions is that they assume that the error count increases evenly over the number of read disturb count. However, this is roughly true for flash memory under the same P/E cycle count, and it is not true for flash memory under different P/E cycle count. The read disturb error count increase per unit reads is larger under high P/E cycles than under low P/E cycles. The current solutions have higher probability to fail when flash memory has been used with more P/E cycles.

Even the flash blocks are under the same P/E cycle count, the same read disturb count can cause different errors. As read disturb will take some time, the errors increased between two neighbor wordline checks will be the sum of the errors caused by read disturb plus the errors caused by the retention during the two read disturb checks. For read intensive workload, the retention time between two read checks is short. However, for read sparse workload, the retention time is long. The error increase caused by read disturb during two neighbor checks is approximately same for both read intensive and read sparse workload. However, the retention time could be significantly different as the period between two neighbor checks for read sparse workload could be much longer than read intensive workload.

Figure 4:
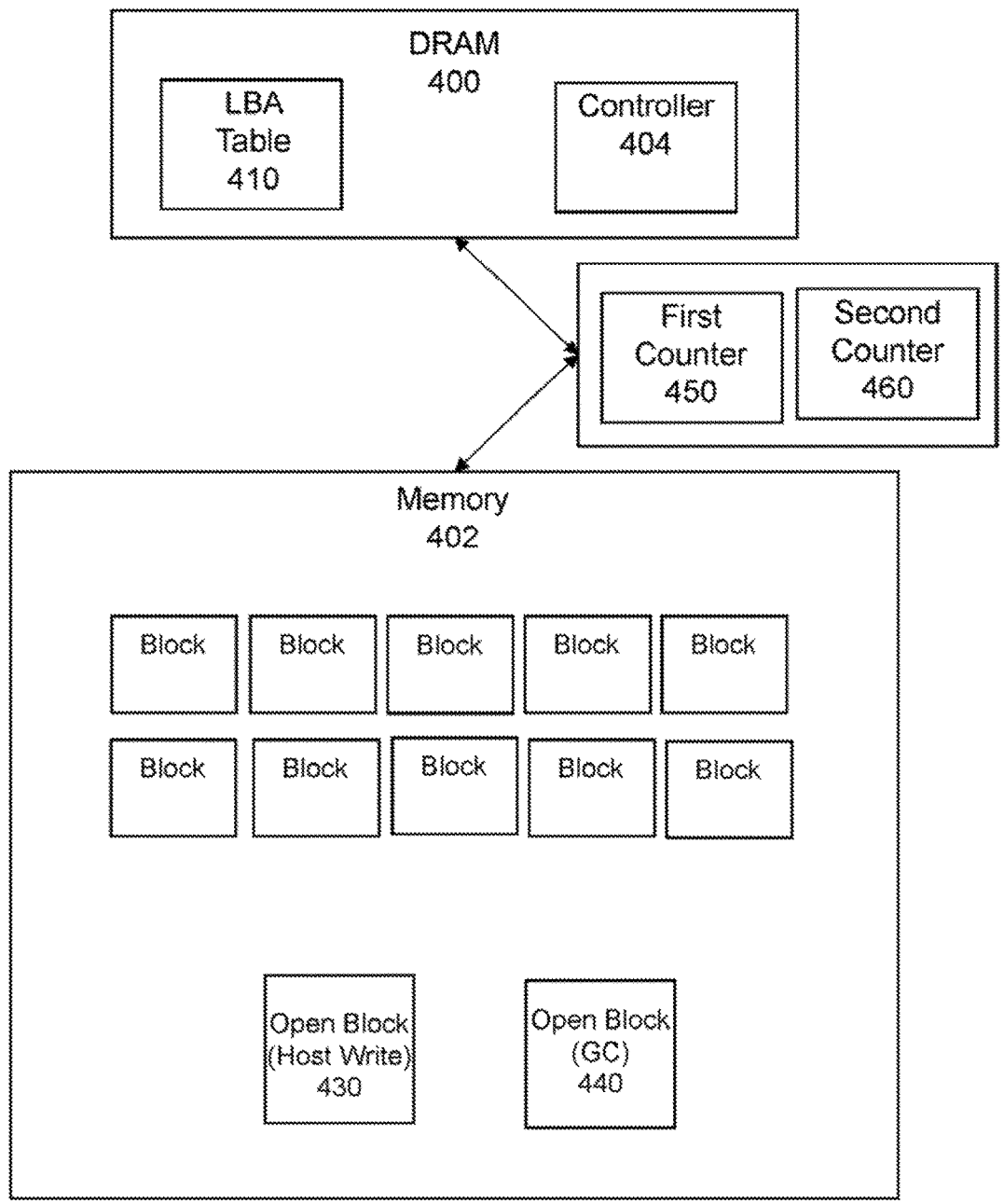
FIG. 4 is a diagram of an example system according to aspects of the invention.

Referring to FIG. 4, an example system 40 for addressing the above described problems is shown. The system 40 includes a volatile memory (DRAM) 400 and a memory 402. The DRAM 400 may include an LBA table 410 and a controller 404, such as the controllers described above. The memory 402 may include a plurality of blocks, an open block for host writes 430 and an open block for garbage collection 440. The system 40 also includes a first counter 450 and a second counter 460. The counters 450 and 460 may be housed on the memory 402 and/or the DRAM 400, or alternatively, on a separate storage.

Figure 5:
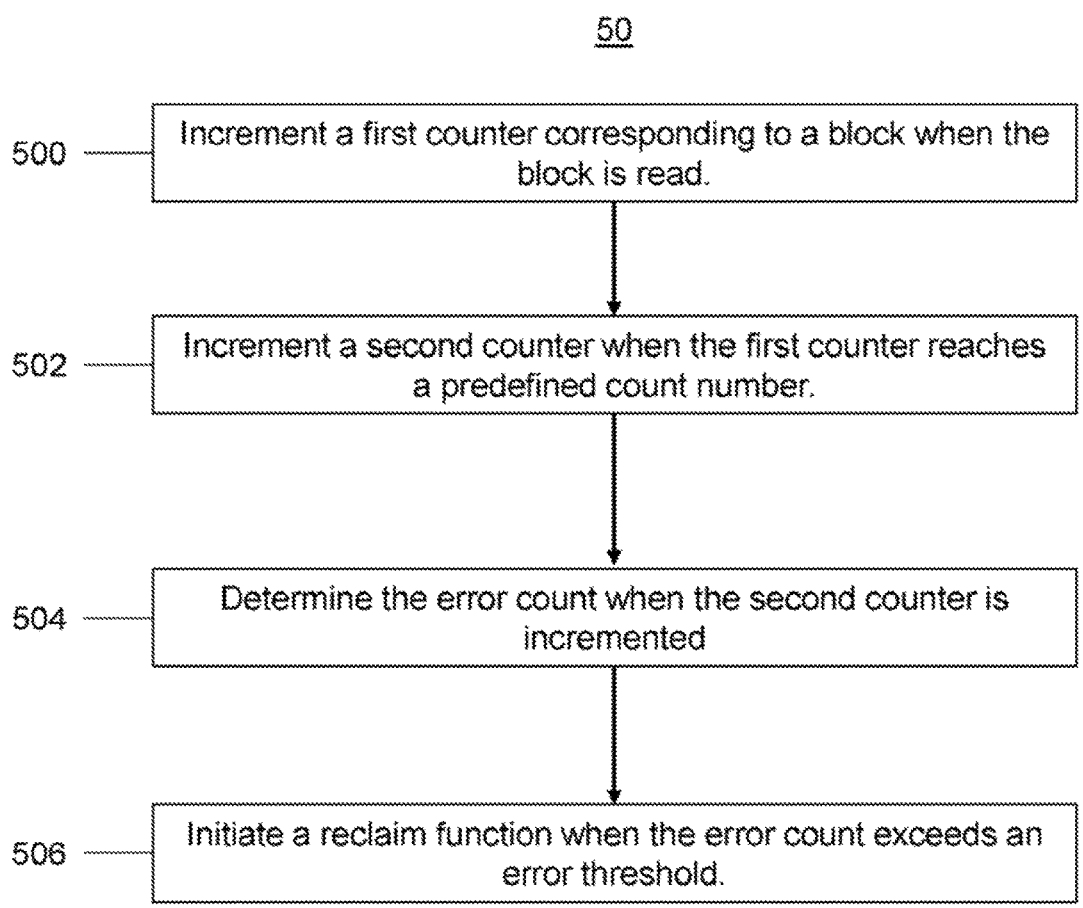
FIG. 5 is a flowchart of steps in a method according to aspects of the invention.

FIG. 5 is a flowchart 50 of steps for determining when to perform a reclaim function. The functionality of the steps and other processes disclosed herein may be operated by a controller such as the controller described above.

At step 500, a first counter corresponding to block is incremented when the block is read. The first counter increases after each read to its corresponding block, and the neighbor wordline error rate will be checked when the first counter reaches a certain predefined count number. The predefined count number may be set to about 10,000 reads, or other values as is desirable according to the particular specifications of the systems.

At step 502, a second counter is incremented when the first counter reaches a predefined counter number. The second counter may be configured to count how many time the first counter has reached the predefined count number (e.g., the number of reads period each block has endured). The second counter may be increased by one each time the number of reads hit to a block has been reached. The first counter may be at least 14 bits to represent 10K reads. The number of bits of the second counter could be much smaller depending on system requirements. We also note that 10K read disturbs is exemplary and not exclusive. Other suitable read disturb counts may be utilized as will be understood by one of skill in the art from the disclosure herein depending on the memory quality and system requirements.

Whenever the first counter reaches the predefined count number, the controller may randomly select one of the neighbor wordline to read. In an embodiment, the page that covers the cross-point of erased state and its direct higher state is read. For example, for 2-bit MLC NAND flash memory, the MSB page error rate is verified, which contains the transition between erased state and P1 state. Such policy would be applied to 3-bit TLC and future flash memory that may contain more number of bits per cell.

At step 504, the error count is determine when the second counter is incremented, and at step 506 a reclaim function is initiated when the error count exceeds an error threshold.

If the second counter is equal to ONE, the error count may be compared to half of the error correction capability of ECC. If it is larger than half of ECC correction capability, all the valid data in current block will be recycled. 50% may be selected because if for the first predefined number count reads, the error count is equal to larger than half ECC correction capability, it is highly possible that the error count will be larger than ECC correction capability after a second predefined number count reads. Thus, the data need to be reclaimed. Note that the error threshold to choose half of ECC correction capability can be configurable to other values depending on system requirements.

If the second counter is greater than ONE, the controller may calculate the average error count per each predefined count number reads in the history by dividing the total error count currently checked over the value of the second counter. If total error count is larger than an error threshold (e.g. 70% ECC correction capability), all valid data in the block will be recycled like current SPRD solution. Otherwise, the controller may calculate the number of errors the system can tolerate in the past to predict new errors that will be newly introduced during the next neighbor check. The maximum tolerable error count is the difference between the ECC correction capability and the total errors that have been accumulated so far. Such difference can be modulated by a coefficient (K) between zero and one for additional design margins. If the average error increase per period (e.g. 10K reads) in the history is larger than the additional errors that ECC can still tolerate, all the valid data in current block will be reclaimed as it cannot be guaranteed that error count can still be less than ECC correction capability. Otherwise, the controller may wait to check neighbor error count after another period.

Additional thresholds may be set, such as a top error threshold and a bottom error threshold. For example, if a top error threshold is set at about 70%, another, bottom error threshold may be set (e.g. 50%). For every check after the first time the first counter reaches the predefined number count reads, if the total error count is less than the bottom error threshold, no read disturb reclaim will be triggered. If a raw error counter is larger than the top error threshold, read disturb reclaim must be triggered. If the total error is between the bottom error threshold and the top error threshold, if the P/E count of this block is less than a certain threshold, no data recycle. Otherwise, the data may be recycled.

Figure 6:
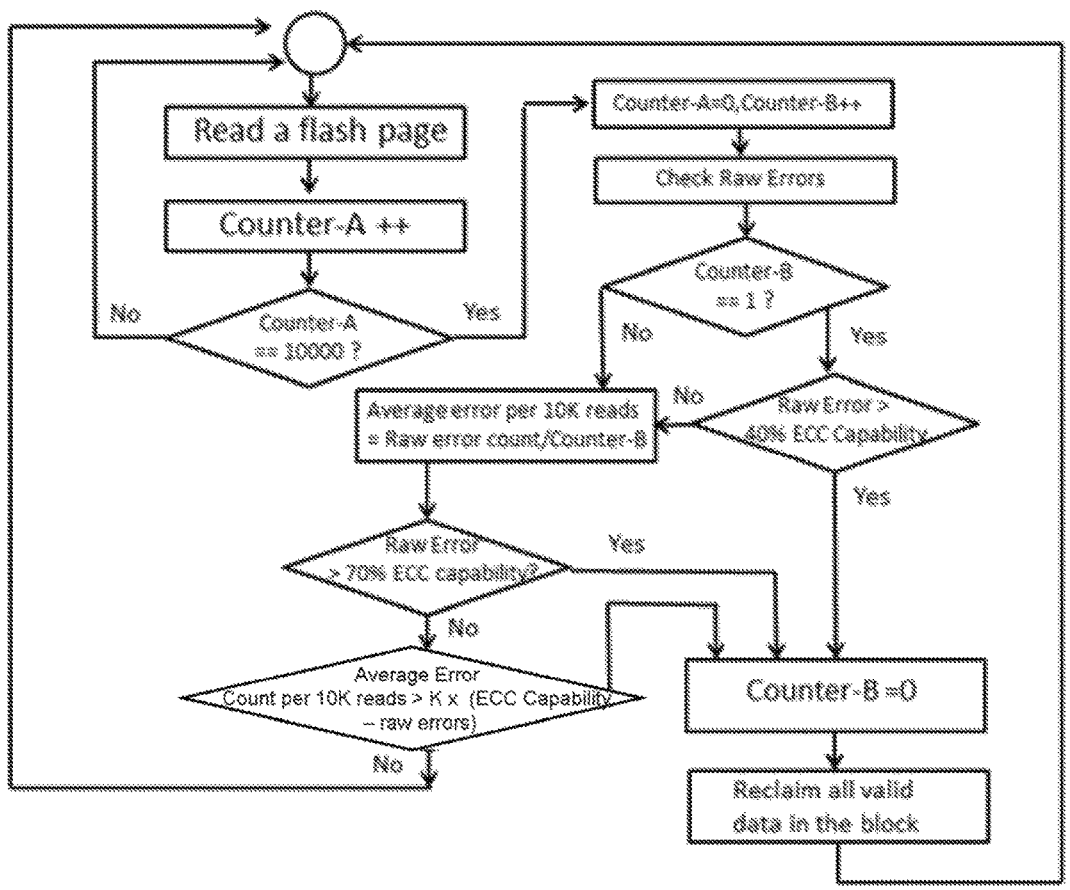
FIG. 6 is an algorithm in accordance with aspects of the invention.

FIG. 6 is an algorithm 60 of example steps in an embodiment of the methods disclosed herein. The values of the thresholds and the predetermined count number are chosen in the algorithm 60 for illustrative purposes, and those of skill in the art will understand alternative values may be selected based on the quality of the memory device and the system requirements.

Initially, a flash page is read, and the first counter (counter-A) is incremented. This process repeated until the first counter reaches the predefined count number (e.g., 10,000). When the first counter reaches the predefined count number, the first counter is reset (e.g., set to zero) and the second counter (counter-B is incremented). The raw errors are then checked.

Next, it is determined if the second counter is equal to one. If it is, then the raw error is compared against an error threshold (e.g., 40% of ECC capability) and, if the raw error exceeds this threshold, the second counter is reset (e.g., set to zero) and all valid data in the block is reclaimed.

If the second counter is not equal to 1, or if the raw error is not greater than the threshold, then the average error per 10,000 reads is calculated as the raw error count divided by the value of the second counter. Then, it is determined if the raw error exceeds the error threshold. If yes, then the second counter is reset and all valid data in the block is reclaimed. If no the average error count is compared to the value of K×(ECC capability−raw errors). If the average error count exceeds this error threshold the second counter is reset and all valid data in the block is reclaimed. If it does not, then the process continues without initiating a reclaim function.

The systems, devices, and methods disclosed herein help more accurately to predict when and whether to reclaim the data. All the exact number of errors can be configurable. Also note that the block can be at super block level, where multiple blocks can form one super block of reads (e.g. 10K reads hit to the block).

Although the foregoing embodiments have been described its some detail for purposes of clarity of understanding, the invention is not limited to the details provided. There are many alternative ways of implementing the invention. The disclosed embodiments are illustrative and not restrictive.

What is claimed is:

1. A memory system, comprising:
    a memory including a plurality of memory blocks; and
    a controller suitable for:
        incrementing a first counter corresponding to a block of the plurality of blocks when the block is read;
        incrementing a second counter when the first counter reaches a predefined count number;
        determining an error count of the block when the second counter is incremented; and
        initiating a reclaim function when the error count exceeds an error threshold, wherein the reclaiming function reclaims valid data in the block when an average error increase per period is larger than a calculated number of errors that the memory system can tolerate.

2. The memory system of claim 1, wherein the error threshold is based on a difference between an error correction code (ECC) correction capability of the memory system and a total number of errors accumulated in the block.

3. The memory system of claim 1, wherein the controller is further suitable for calculating a number of errors the memory system can tolerate when the error count does not exceed the error threshold.

4. The memory system of claim 1, wherein the controller is further suitable for selecting a neighbor wordline to read when the first counter reaches the predefined count number.

5. The memory system of claim 1, wherein the predefined count number is set to about 10,000 reads.

6. A method, comprising:
    incrementing a first counter corresponding to a block of a plurality of blocks of a memory when the block is read;
    incrementing a second counter when the first counter reaches a predefined count number;
    determining an error count of the block when the second counter is incremented; and
    initiating a reclaim function when the error count exceeds an error threshold, wherein the reclaiming function reclaims valid data in the block when an average error increase per period is larger than a calculated number of errors that the memory system can tolerate.

7. The method of claim 6, wherein the error threshold is based on a difference between an error correction code (ECC) correction capability of the memory system and a total number of errors accumulated in the block.

8. The method of claim 6, further comprising calculating a number of errors the memory system can tolerate when the error count does not exceed the error threshold.

9. The method of claim 6, further comprising selecting a neighbor wordline to read when the first counter reaches the predefined count number.

10. The method of claim 6, wherein the predefined count number is set to about 10,000 reads.

11. A memory device, comprising:
    a memory including a plurality of memory blocks;
    a first counter;
    a second counter; and
    a controller configured to:
        increment the first counter corresponding to a block of the plurality of blocks when the block is read;
        increment the second counter when the first counter reaches a predefined count number;
        determine an error count of the block when the second counter is incremented; and
        initiate a reclaim function when the error count exceeds an error threshold, wherein the reclaiming function reclaims valid data in the block when an average error increase per period is larger than a calculated number of errors that the memory system can tolerate.

12. The memory device of claim 11, wherein the error threshold is based on a difference between an error correction code (ECC) correction capability of the memory system and a total number of errors accumulated in the block.

13. The memory device of claim 11, wherein the controller is further configured to calculate a number of errors the memory system can tolerate when the error count does not exceed the error threshold.

14. The memory device of claim 11, wherein the controller is further configured to select a neighbor wordline to read when the first counter reaches the predefined count number.

15. The memory device of claim 11, wherein the predefined count number is set to about 10,000 reads.

* * * * *